United States Patent
Graham et al.

(10) Patent No.: US 6,692,816 B2
(45) Date of Patent: Feb. 17, 2004

(54) ABRASION RESISTANT ELECTRODE AND DEVICE

(75) Inventors: Paul D. Graham, Woodbury, MN (US); Douglas A. Huntley, Maplewood, MN (US)

(73) Assignee: 3M Innovative Properties Company, St Paul, MN (US)

( * ) Notice: Subject to any disclaimer, the term of this patent is extended or adjusted under 35 U.S.C. 154(b) by 0 days.

(21) Appl. No.: 09/995,943

(22) Filed: Nov. 28, 2001

(65) Prior Publication Data

US 2003/0099818 A1 May 29, 2003

(51) Int. Cl.⁷ ................................................. B32B 3/28
(52) U.S. Cl. ....................................... 428/182; 428/209
(58) Field of Search ................................. 428/209, 182

(56) References Cited

U.S. PATENT DOCUMENTS

| | | | |
|---|---|---|---|
| 2,279,567 A | * | 4/1942 | Holman |
| 2,988,839 A | * | 6/1961 | Greenman et al. |
| 3,658,954 A | * | 4/1972 | Broadbent |
| 4,519,065 A | | 5/1985 | Lewis et al. |
| 4,855,984 A | * | 8/1989 | Gerber ............... 369/54 |
| 5,073,237 A | | 12/1991 | Bacher et al. |
| 5,103,443 A | * | 4/1992 | Gerber ............... 369/100 |
| 5,413,659 A | | 5/1995 | Koskenmaki et al. |
| 5,512,161 A | | 4/1996 | Dinglreiter et al. |
| 5,529,829 A | | 6/1996 | Koskenmaki et al. |
| 5,928,767 A | * | 7/1999 | Gebhardt et al. ........ 428/209 |

FOREIGN PATENT DOCUMENTS

| | | |
|---|---|---|
| DE | 199 35 558 A1 | 3/2001 |
| WO | WO 95/09456 | 4/1995 |
| WO | WO 96/41508 | 12/1996 |
| WO | WO 96/41509 | 12/1996 |
| WO | WO 00/53423 | 9/2000 |
| WO | WO 01/60589 A1 | 8/2001 |

OTHER PUBLICATIONS

Xia et al., "Soft Lithography", Angew. Chem. Int. Ed., 1998, 37, pp. 550–575 (No Month).

Stearns, A Novel, Chemical–Free, Roll–to–Roll Flex Process, Printed from Website: www.circuitree.com, Posted Oct. 1, 2000.

* cited by examiner

*Primary Examiner*—Cathy Lam
(74) *Attorney, Agent, or Firm*—Scott A Bardell

(57) ABSTRACT

The invention provides abrasion resistant electrodes that comprise metal-coated conductive valleys between protrusions having a fractured metal coating thereon; the fractured metal coated protrusions are non-conductive. Electrical devices made from a plurality of said electrodes; and methods of making said devices.

11 Claims, 2 Drawing Sheets

110 μm

500 μm

US 6,692,816 B2

ABRASION RESISTANT ELECTRODE AND DEVICE

FIELD OF INVENTION

The present invention relates to electrodes, and methods of making and using such electrodes.

BACKGROUND

As electronic devices become increasingly more compact and portable, the size of electrodes used in such devices must also necessarily decrease. Useful electrodes in such devices are typically flexible and are closely spaced, but electrically isolated conductive pathways. Typically, it is desirable, or even necessary, to use electrical devices that have abrasion resistant electrodes (i.e., electrodes that are protected from abrasion so as to provide robust consistent conductivity).

For example, glucose monitoring devices typically contain an electrical device having electrodes made from metal-coated, non-conductive films. In converting these metal-coated films into such electrodes, it is desirable, or necessary, to not scratch or abrade the metal-coated portion of the electrode. Scratching or abrading of the metal-coated portion of such an electrode may cause a total loss or a decrease in conductivity and may lead to premature failure of the electrical device containing such an electrode. A decrease in conductivity may result in a device providing an incorrect reading while still appearing to be functional. Conventional methods such as those methods that use conductive inks or thin metal wires or photolithography are relatively complex and costly. Other methods provide metal-coated plastic devices in which the protrusions of the device are conductive. A known embossing method embosses a metal-coated dielectric and then removes the metal coating from the protrusions using a flycutting technique.

While conventional techniques for making such electrodes are useful, there is a need to consistently make abrasion resistant electrodes, more easily and less costly.

SUMMARY OF THE INVENTION

In one aspect, the invention provides an abrasion resistant electrode comprising a polymeric substrate having two parallel non-conductive protrusions provided thereon and separated by a conductive valley, wherein the non-conductive protrusions have a coating of fractured metal.

In another aspect, the invention provides an electrical device comprising a plurality of abrasion resistant electrodes. The electrical device comprises a polymeric substrate having a plurality of non-conductive protrusions separated by conductive valleys, wherein the non-conductive protrusions have a coating of fractured metal.

In another aspect, the invention provides a method of making an abrasion resistant electrode or device. The method comprises the steps of providing a metal-coated non-conductive substrate comprising a thermoplastic polymer, contacting the metal-coated substrate with an embossing tool using sufficient heat and pressure to form the electrode or device. The embossing tool comprises a material having an engineering strain of less than 10%.

The electrodes and electrical devices of the present invention have simple construction and are relatively easy and inexpensive to make.

DETAILED DESCRIPTION

Figure 1:
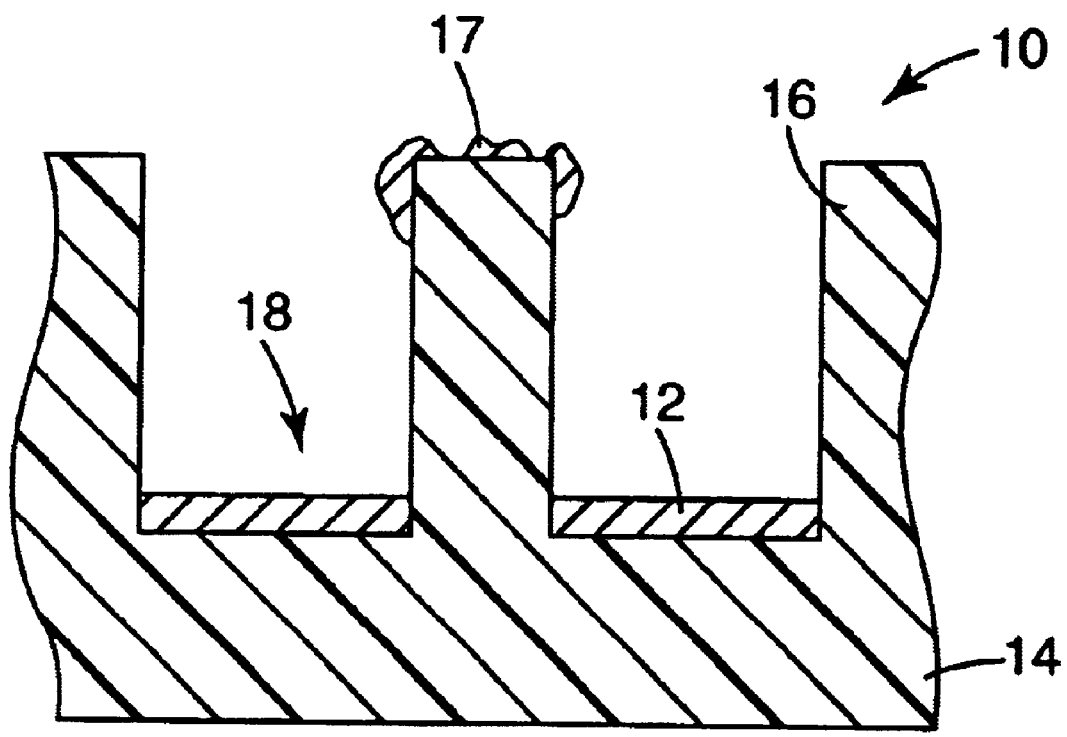
FIG. 1 is an schematic cross-sectional view of an exemplary abrasion resistant electrode according to the present invention.

Referring to FIG. 1, abrasion resistant electrical device comprising a plurality of electrodes according to the present invention 10 comprises a non-conductive substrate 14 having conductive valleys 18 between non-conductive protrusions 16. Each conductive valley between two non-conductive protrusions is an electrode. The conductive valleys comprise a metal layer or coating 12 on top of the non-conductive substrate 14. The non-conductive protrusions have a fractured metal layer or coating 17 substantially covering the non-conductive protrusions. The fractured metal coating is non-conductive in the aggregate. In this embodiment 10, at least a portion of the non-conductive substrate 14 between conductive valleys 18 and non-conductive protrusions 16 has metal coating 12 and fractured metal coating 17. However, it is to be understood that some electrodes in a device may have protrusions that have a fractured metal coating that abuts the conductive metal of the valleys or fractured metal coating that extends from the tops of the protrusions to any point along the protrusions between the tops and the conductive metal valleys.

Although the above FIG. 1 shows the conductive valleys parallel to one another in a linear fashion, the invention disclosed herein is meant to encompass any parallel configuration of conductive valleys and non-conductive protrusions, for example, where the conductive valleys are one continuous conductive valley in the shape of a spiral.

As used in the present invention, a non-conductive substrate is typically used to make abrasion resistant electrodes to be used in electrical devices. The non-conductive substrate is the support for the continuous metal coating, which in combination forms the conductive valleys and the electrode. A shown above in FIG. 1, the substrate has protrusions and valleys. As used in the present invention, the materials used to make the substrate are typically chosen based on properties, such as, for example, abrasion resistance, flexibility, conductivity (i.e., non-conductivity), optical clarity, gas permeability, toughness, thermal stability, melting point, and heat deflection temperature. Other considerations include the method or methods used to form the substrate into protrusions and valleys.

Abrasion resistance is typically desirable in order to protect the electrodes (i.e., conductive valleys) from abrasion. Electrodes that become abraded (e.g., scratched) may provide inconsistent electrical signals which is typically undesirable. Substrates that provide suitable abrasion resistance may vary depending on the particular use of the abrasion resistant electrode. Abrasion resistance is controlled by the combination of a number of properties including hardness, flexural modulus, geometry, and toughness. Optionally, fillers such as glass beads, glass fibers, or inorganic particles may be added to thermoplastic polymer to improve its abrasion resistance. Various lubricants such as fluoropolymer resins, graphite, or perfluoropolyether polymers may be applied to the substrate or compounded directly into the thermoplastic polymer to improve abrasion resistance.

The flexibility of the substrate will depend on the particular use of the abrasion resistant electrode. Substrate with high flexibility may provide abrasion resistant electrodes that are typically desirable in order to connect electrical components in close proximity and/or in undefined spatial relationships. Such electrodes may be bent or twisted, for example, in order to connect such electrical components.

The substrates of the invention are non-conductive. As used herein, "non-conductive" means a plastic or polymeric substrate. Exemplary substrates that provide at least one or more of the properties discussed above include those that comprise thermoplastic polymers and combinations thereof and combinations or thermoplastic and thermoset polymers such as blends or multilayer films. Suitable thermoplastic polymers are well known in the art and include, for example, polytetrafluoroethylene, poly(butylene terephthalate), polyacetal, and glycol-modified poly(ethylene terephthalate). Suitable thermoset polymers are well known in the art and include, for example, crosslinked acrylates, polyepoxide resins, and polydimethylsiloxane resins.

Useful substrates are typically in the form of a film. Depending on the method or methods used in making substrate film, the film may be smooth or have a pattern. Methods for making suitable smooth film substrate are well known in the art and include, for example, cast film extrusion and/or blown film extrusion. One example of a substrate film having a pattern is "microreplicated" film. Methods for making microreplicated films are well known in the art and include, for example, continuous cast and cure processes. Substrate films used in the present invention may vary in thickness depending on the desired properties of the abrasion resistant electrode. Many properties (e.g., flexibility, optical clarity, gas permeability) of substrate film tend to vary with substrate film thickness. For example, a given substrate film flexibility tends to be more flexible (i.e., a relatively higher flexural modulus value) as the substrate film thickness decreases. Optical clarity and gas permeability of a given substrate film tend to increase (i.e., as the substrate film thickness decreases). In one embodiment, substrate film may have a thickness value in the range from about one micrometer to about 25,000 micrometers. In another embodiment, the substrate film may have a thickness value in the range from about 12 micrometers to about 10,000 micrometers. In still another embodiment, the substrate film may have a thickness value in the range from about 50 micrometers to about 625 micrometers.

The electrodes of the invention include a metal layer over at least portions of the substrate. Examples of useful metals include silver, aluminum, nickel, gold, indium/tin oxide, copper, zinc, and their alloys, and combinations thereof. The thickness of the metal coating may range from about 200 angstroms to about 2 millimeters, 500 angstroms to about 1 millimeter, and from about 500 angstroms to about 20,000 angstroms, and any whole or fractional thickness in between 200 angstroms and 2 millimeters.

The scratch resistant electrodes of the invention are generally made by coating a plastic or polymeric film with a metal and then embossing the multilayer construction using an appropriate embossing tool using heat and pressure. The amount of heat required for efficient embossing is dependent in part on the thermal properties of the thermoplastic polymer. Thermoplastic polymers that are crystalline or semi-crystalline are generally heated to a temperature higher than their melting point by not less than 150° C., not less than 100° C., not less than 60° C., and not less than 30° C. in other embodiments. Thermoplastic polymers that are substantially amorphous are generally heated to a temperature that exceeds their glass transition temperature by about 10° C. to about 150° C., by about 20° C. to about 100° C., and by about 40° C. to about 80° C. in other embodiments.

The temperature of the embossing tool required for efficient embossing of a polymer is dependant in part by the thermal properties of the thermoplastic polymer. The temperature of the embossing tool should be generally maintained at a temperature that allows the thermoplastic polymer to flow substantially into all of the depressed portions of the tool before the polymer solidifies. For many thermoplastic polymers, the embossing tool should be heated to a temperature of at least 60° C. below its Vicat softening temperature as described in ASTM D 1525. For other thermoplastic polymers, the embossing tool should be heated to a temperature of at least 30° C. below its Vicat softening point or a temperature of at least 15° C. below its Vicat softening point. The metal-coated plastic substrate is pressed against the embossing tool under an applied pressure that ranges from about 0.1 Mpa to about 100 Mpa, about 0.5 Mpa to about 60 Mpa, or about 0.5 Mpa to about 20 Mpa.

The embossing tool is comprised of materials that do not substantially deform when subjected to the heat and pressure required to emboss a thermoplastic polymer. Undue tool distortion during the embossing step can result in metal fracture throughout the conductive valleys, rendering the electrodes non-conductive. Useful embossing tools are comprised of materials that experience an engineering strain of less than 10%, and less than 2%, less than 0.3%, or less than 0.1% in other embodiments when subjected to heat and pressures required for efficient embossing of thermoplastic polymer. Useful embossing tools may be fabricated from a variety of metals and metal alloys including copper, metal-plated copper, magnesium, aluminum, steel, stainless steel, and the like.

The plastic or polymeric film may be cast or extruded. The metal coating is typically applied by thermal evaporation, sputtering, chemical vapor deposition (CVD), diamond CVD, plasma-assisted CVD, electroplating, and electroless plating.

The scratch resistant electrodes of the invention may be used in instruments or devices such as blood glucose monitoring devices, radio frequency ID tags, micro-scale reaction vessels, and pressure sensors.

Advantages and embodiments of this invention are further illustrated by the following examples, but the particular materials and amounts thereof recited in these examples, as well as other conditions and details, should not be construed to unduly limit this invention. All parts and percentages are by weight unless otherwise indicated.

EXAMPLES

Example 1

An approximately 1000 Angstrom thick coating of silver was applied onto a 10 mil (0.25 mm) thick poly(ethylene terephthalate) glycol (PETG) film (available from Spartech Plastics, Evanston, Ill.). The metal-coated substrate was embossed using an engraved magnesium plate in a heated compression-molding apparatus. The engraved magnesium plate had an array of parallel ribs or protrusions that were each about 50 micrometers thick, about 70 micrometers in height, and spaced with a pitch of about 200 micrometers. The engraved surface of the magnesium plate was contacted with the metal-coated surface of the PETG film and this construction was inserted into a compression-molding machine. The platens in the heated compression molded apparatus were heated to a temperature of about 187° C., the magnesium plate/metal-coated substrate construction was inserted and a pressure of about 10 MPa was applied to the construction for about 5 minutes. The pressure was maintained for an additional 5–10 minutes while the heated platens were cooled to about 55° C. The plates were opened and the embossed metal-coated substrate was removed.

The conductivity of the metal-coated substrate was measured both parallel to the protrusions and normal to the protrusions using a Hewlett-Packard 973A multimeter equipped with standard test probes. The test probes were separated by about 4.5 millimeters in a direction parallel to the electrodes and the multimeter reading was about 31 Ohms. The test probes were then separated by about 4 millimeters in a direction perpendicular to the electrodes and the multimeter produced a reading of "OL" indicating the resistance was too high to be measured. These results show that the surface of the metal-coated substrate was conductive in a direction parallel to the protrusions, that is, in the valleys, and the metal-coated substrate was not conductive in a direction normal to the protrusions.

Figure 2:
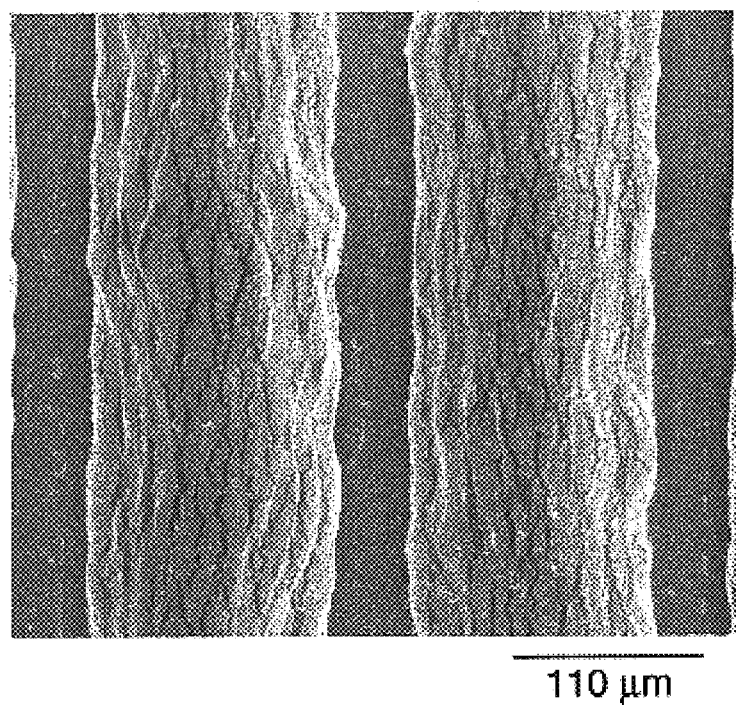
FIG. 2 is a printed, digitized image of exemplary abrasion resistant electrodes according to the present invention.
Figure 3:
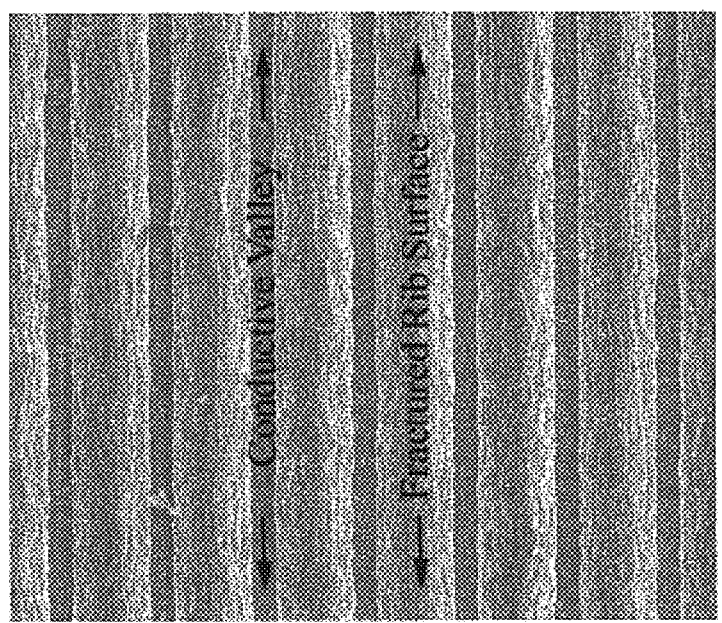
FIG. 3 is a printed, digitized image of exemplary abrasion resistant electrodes according to the present invention.

A portion of the metal-coated substrate was analyzed by scanning electron microscopy. The resulting images are shown in FIGS. 2 and 3. Both images clearly show continuous conductive metal-coated valleys that are surrounded by protrusions having a fractured silver coating.

Comparative Example 1

A silver-coated PETG substrate was embossed as described above except the silver coating was about 5000 micrometers thick, and the embossing tool was made from an RTV silicone (SILASTIC J, available from Dow Corning, Midland, Mich.). Heat and pressure were applied as described above. The conductivity of the resulting embossed silver-coated substrate was measured as described above and the substrate was found to be non-conductive in either the parallel or normal directions. Micrographs of a portion of the substrate show that both the metal-coated valleys and protrusions had a fractured silver coating.

All patents, patent applications, and publications cited herein are each incorporated by reference, as if individually incorporated. The various modifications and alterations of this invention will be apparent to those skilled in the art without departing from the scope and spirit of this invention. This invention should not be restricted to that set forth herein for illustrative purposes.

What is claimed is:
1. An abrasion resistant electrode comprising:
a metal coating on a polymeric substrate having two parallel non-conductive protrusions provided thereon and separated by a metal-coated conductive valley, wherein the metal coating on the protrusions is fractured and the fractured metal-coated protrusions are non-conductive in a direction normal to the protrusions; and wherein said metal-coated conductive valleys are electrically isolated from said fractured metal-coated protrusions.

2. An electrical device comprising a plurality of abrasion resistant electrodes according to claim 1.

3. An electrical device according to claim 2, wherein said abrasion resistant electrodes are flexible.

4. An electrical device according to claim 3, wherein said polymeric substrate comprises thermoplastic material.

5. An electrical device according to claim 4, wherein said thermoplastic material is selected from the group consisting of polytetrafluoroethylene, poly(butlylene terephthalate), polyacetal, glycol-modified poly(ethylene terephthalate), and combinations thereof.

6. An electrical device according to claim 3, wherein said metal coating comprises silver, aluminum, nickel, gold, indium/tin oxide, copper, zinc, and their alloys.

7. An electrical device according to claim 3, wherein said metal coating on said conductive valleys has a thickness in the range from about 200 angstroms to about 2 millimeters.

8. An electrical device according to claim 3, wherein at least a portion of said substrate between at least one said valley and at least one said protrusion has fractured metal coating.

9. An electrical device according to claim 3, wherein substantially all of said substrate between at least one said valley and at least one said protrusion has fractured metal coating.

10. A blood glucose monitoring device comprising an electrical device of claim 2.

11. A radio frequency ID tag comprising an electrical device of claim 2.

* * * * *

UNITED STATES PATENT AND TRADEMARK OFFICE
CERTIFICATE OF CORRECTION

| | | |
|---|---|---|
| PATENT NO. | : 6,692,816 B2 | |
| APPLICATION NO. | : 09/995943 | |
| DATED | : February 17, 2004 | |
| INVENTOR(S) | : Paul D. Graham | |

It is certified that error appears in the above-identified patent and that said Letters Patent is hereby corrected as shown below:

Title Page
Item (57), ABSTRACT, delete "the fractured metal coated protrusions are non-conductive.  Electrical" and insert in place thereof -- electrical --.

Column 6
Line 20, delete "butlylene" and insert in place thereof -- butylene --.

Signed and Sealed this

Seventeenth Day of July, 2007

JON W. DUDAS
*Director of the United States Patent and Trademark Office*